United States Patent
Hirano et al.

(10) Patent No.: US 6,182,369 B1
(45) Date of Patent: *Feb. 6, 2001

(54) PATTERN FORMING APPARATUS

(75) Inventors: Ryoichi Hirano; Shusuke Yoshitake, both of Yokohama; Kazuto Matsuki, Tokyo; Toru Tojo, Kanagawa-ken, all of (JP)

(73) Assignee: Kabushiki Kaisha Toshiba, Kawasaki (JP)

(*) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/038,038

(22) Filed: Mar. 11, 1998

(30) Foreign Application Priority Data

Mar. 11, 1997 (JP) .................................. 9-056309

(51) Int. Cl.[7] ........................ G01B 5/004; G01P 21/00; G06F 19/00; G03F 7/20

(52) U.S. Cl. ........................ 33/1 M; 33/503; 33/504; 33/702; 33/706; 324/758; 702/94; 702/95; 702/150

(58) Field of Search ................... 33/1 M, 503, 504, 33/702, 706; 324/758, 751, 752; 702/94, 95, 150

(56) References Cited

U.S. PATENT DOCUMENTS

| | | | |
|---|---|---|---|
| 4,914,601 | * 4/1990 | Smyth, Jr. | 702/94 |
| 5,065,092 | * 11/1991 | Sigler | 324/758 |
| 5,105,207 | * 4/1992 | Nelson | 347/129 |
| 5,107,349 | * 4/1992 | Ng et al. | 358/457 |
| 5,111,302 | * 5/1992 | Chan et al. | 358/298 |
| 5,185,852 | * 2/1993 | Mayer | 358/298 |
| 5,291,392 | * 3/1994 | Gerber et al. | 347/106 |
| 5,519,415 | * 5/1996 | Raskin | 347/9 |
| 5,583,443 | * 12/1996 | McMurtry et al. | 324/758 |
| 5,602,943 | * 2/1997 | Velho et al. | 358/298 |
| 5,832,415 | * 11/1998 | Wilkening et al. | 702/95 |

FOREIGN PATENT DOCUMENTS

| | | |
|---|---|---|
| 6-129814 | 5/1994 | (JP) . |
| 8-250394 | 9/1996 | (JP) . |

OTHER PUBLICATIONS

Hideo Yoshihara, SPIE–The International Society for Optical Engineering, vol. 2512, pp. 235–241, "Photomask and X–Ray Mask Technology II", Apr. 20–21, 1995.

Ryoichi Hirano, et al., American Vacuum Society, Journal of Vacuum Science Technology, vol. 13, No. 6, pp. 2625–2629, "Pattern Positioning Error of Reticle Writing Induced by Reticle Clamping", Nov./Dec. 1995.

* cited by examiner

*Primary Examiner*—Randy W. Gibson
(74) *Attorney, Agent, or Firm*—Oblon, Spivak, McClelland, Maier & Neustadt, P.C.

(57) ABSTRACT

A pattern forming apparatus comprising a sample base for positioning a sample on the base and moving a drawing position of the sample, a position measuring unit for measuring a position of the sample base, a correcting unit for mutually independently correcting drawing positions at those respective areas into which a whole drawing section of the sample is divided, the drawing position being calculated by the position measuring unit at the respective area, and a drawing unit for drawing a pattern on the sample on the basis of the position of the sample base measured by the position measuring unit and drawing position of the respective area corrected by the correcting unit.

6 Claims, 5 Drawing Sheets

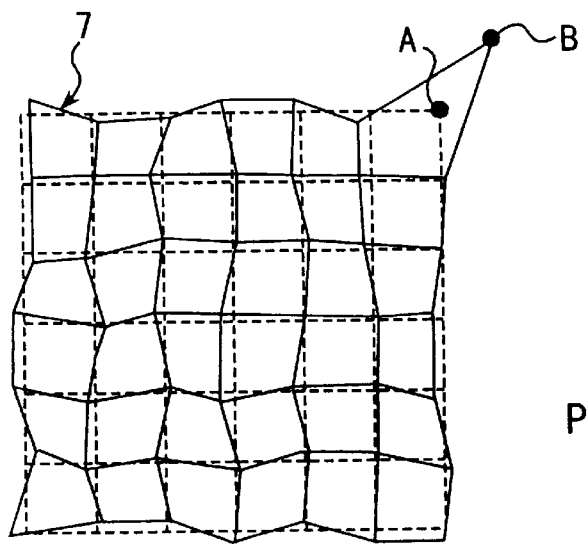
FIG. 1
PRIOR ART
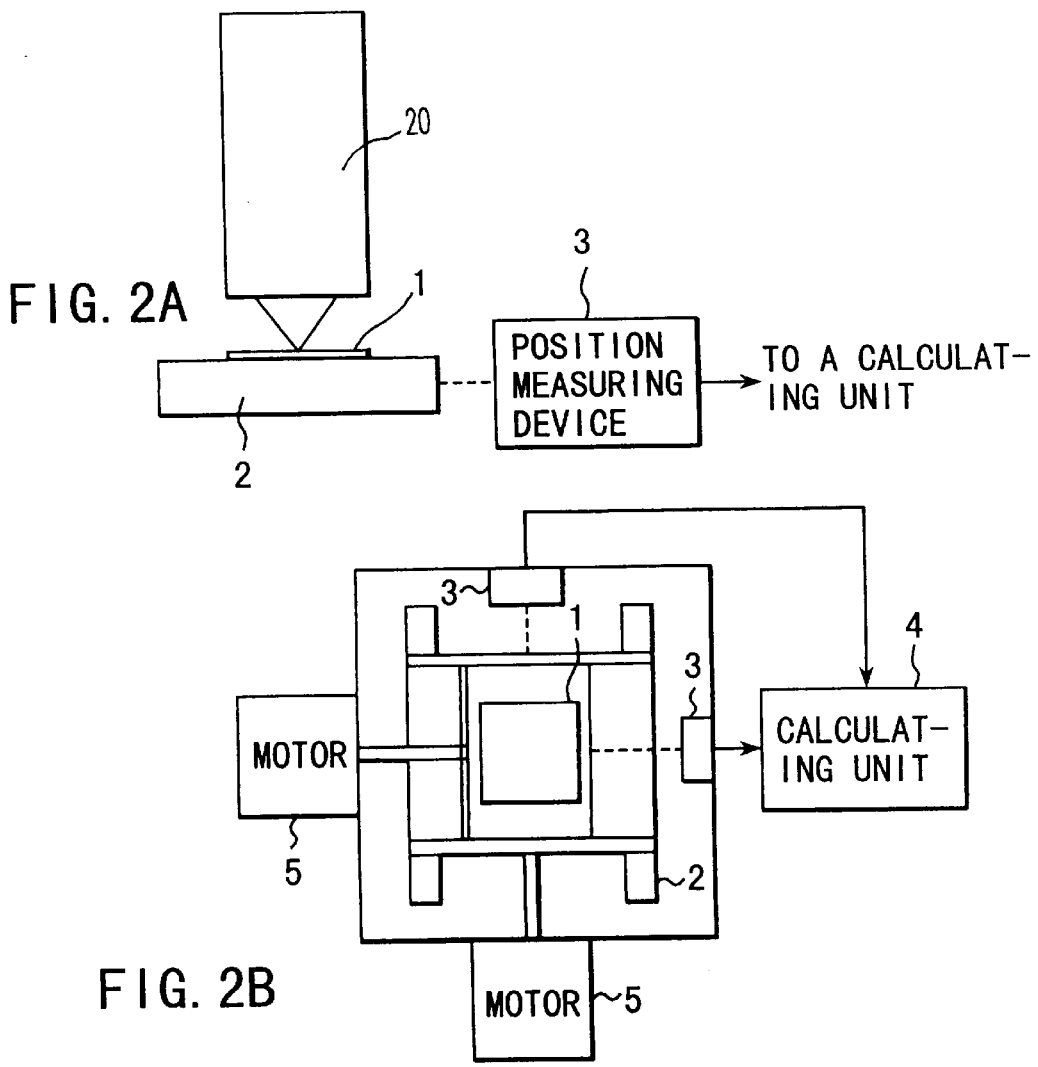
FIG. 2A
FIG. 2B

PATTERN FORMING APPARATUS

BACKGROUND OF THE INVENTION

The present invention relates to a pattern forming apparatus for forming a very fine device pattern, such as a semiconductor IC circuit pattern, on a sample, such as a semiconductor wafer and pattern transferring mask, with the use of a beam such as a charged beam.

With a recent high integration of the LSI, a corresponding circuit line's width has been becoming finer and finer in a corresponding semiconductor device. Such semiconductor devices are formed by transferring drawing patterns, that is, desired circuit patterns corresponding to several tens of original patterns, on a mask such as a reticle, sequentially to light exposure areas on a wafer through a high-accurate alignment and performing chemical processing such as etching. Here, as a transferring device use is made of a stepper having a high accurate optical system. The wafer is held in place on a high accurate XY stage so as to allow a whole wafer surface on the transferring side to be exposed with light. The wafer is moved in a step & repeat fashion relative to the optical system and such a transferring apparatus is called a stepper.

The original pattern is formed as a Cr pattern on a glass substrate finished with high accuracy. Upon pattern formation, a glass substrate with Cr evaporated on one side is uniformly coated with a resist and the whole substrate surface is scanned with an energy beam, such as a focusing electron beam or laser beam, in accordance with design data to make a desired area of the resist photosensitized. And the photosensitized resist is developed to provide a resist pattern and then the Cr is etched with the use of the resist pattern to obtain a desired pattern. Since the pattern is formed with the focused spots joined, it is possible to form a high accurate pattern depending upon how the beam is controlled.

The Cr pattern formed on the glass substrate with the use of such a pattern drawing apparatus need be aligned as a high accurate overlay on a circuit pattern on the wafer, so that a pattern transfer is carried out.

However, there are sometimes the cases where the wafer itself may be deformed with a progress of its processing. In order to realize such a pattern transfer process with such high accurate overlay relative to the circuit pattern on the deformed wafer, it is necessary that the circuit pattern on the glass substrate be displaced to achieve an alignment with the deformed wafer.

In the case where a first transfer process of the circuit pattern on the wafer has been made with the use of a deformed-pattern-formed glass substrate, it followed that, in order to achieve a high accurate overlay, it is necessary that a pattern on the glass substrate used at a second and subsequent transfer processes has to be set in a deformed sate as in the case of the circuit pattern used in the first transfer process.

As the method for displacing such a drawing position use is made of a method by which a correction amount at a given point (X, Y) is defined by a function and found through its calculation as, for example, in JPN PAT APPLN KOKAI PUBLICATION NO. 7-52948.

Since, however, the correction value in a given coordinate on a whole drawing surface is calculated, there arises the following problem.

In FIG. 1, A represents a grid point showing an ideal drawing position and B a grid point given by correction. If, as shown in FIG. 1, a correction amount is locally greater in a portion of the drawing area on the whole drawing section 7, it is difficult to represent such correction amount, so that correction cannot be achieved with high accuracy. If a higher-degree polynomial equation is used as a function so as to make its approximate precision higher, then the calculation procedure of the correction equation becomes vast and complicated.

Thus, in the case where the whole drawing section of a sample is to be corrected in such a conventional method, for example, the correction amount is locally greater in a portion of the correction area, it has been difficult to make correction with high precision.

BRIEF SUMMARY OF THE INVENTION

It is accordingly the object of the present invention to provide a pattern forming apparatus which can correct a pattern position with high accuracy.

The object of the present invention can be achieved by providing a pattern forming apparatus comprising a sample base for positioning a sample thereon and moving a drawing position of the sample;

position measuring means for measuring a position of the sample base;

correction means for mutually independently correcting drawing positions at those respective areas into which a whole drawing section of the sample is divided, the drawing position being calculated by the position measuring means at the respective area; and drawing means for drawing a pattern on the sample on the basis of the position of the sample base measured by the position measuring means and drawing position of the respective area corrected by the correcting means.

According to the present invention, the whole drawing section of the sample is divided into a plurality of areas and the correction of the drawing position at the respective area is made mutually independently for the respective area, whereby, even if, for example, the correction amount is locally greater at a portion of the whole drawing section, it is possible to correct the drawing position with high accuracy.

Further, in the present invention, since the whole drawing section of the sample is divided into a plurality of areas and the correction is made for the respective divided areas, that is, the correction is made, taking the drawing position (drawing coordinate) over the whole drawing section of the sample into consideration, it is possible to effect high accurate correction of the drawing position over a whole surface of the sample, such as a mask and wafer. For example, if any correction amount given at the time of drawing a sub-deflection area (a subfield) on the sample is given to a respective one of a plurality of areas into which a main deflection area (a frame) is divided, correction is made based on only information in the main deflection area irrespective of whether the main deflection area is at a marginal area or at a central area of the sample. That is, such correction is made without giving no consideration to the drawing position (drawing coordinate) over the whole drawing section, so that it is difficult to obtain adequate correction accuracy.

According to the present invention, high accurate correction can be made over a whole drawing section by incorporating, as information, the coordinate in the whole drawing area section.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a view showing how to impart a correction amount on a conventional forming apparatus;

FIGS. 2A and 2B, each, are a diagrammatic view showing a pattern forming apparatus according to an embodiment of the present invention;

DETAILED DESCRIPTION OF THE INVENTION

Figures 3A, 3B:
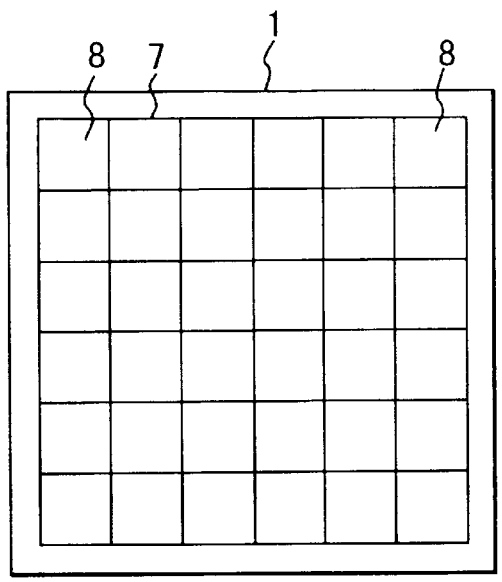
FIGS. 3A and 3B, each, show a principle on how to impart a correction amount on a pattern forming apparatus according to the embodiment of the present invention.

The embodiments of the present invention will be explained below in conjunction with the drawing of an electron beam as an example.

FIG. 2A is a view showing a relation among a drawing device, mask, XY stage and position measuring device in a pattern forming apparatus of the present invention. FIG. 2B is a plan view showing a relation among the mask, XY stage and position measuring device. As shown in FIG. 2A, the mask 1 allows a circuit pattern, etc., to be drawn by the drawing device 20. Here, the drawing device, like an ordinary electronic beam drawing device, comprises an electron gun unit, lens, deflection units, shaping aperture, etc. The mask 1 is placed on the XY stage 2 and allows its drawing area to be scanned with a movement of the XY stage 2. The position measuring device 3 measures a coordinate on the XY stage. A calculating unit 4 calculates an amount of correction relative to an ideal drawing position on the mask 1. Here, the ideal drawing position is intended to mean a drawing position where the correction of any drawing position may not be necessary such as there is no deformation or distortion, for instance, on the mask. A motor 5 moves the XY stage 2. It is to be noted that the basic arrangement, drawing operation, etc., of the apparatus is substantially the same as those of the ordinary electron beam drawing apparatus except the calculating unit 4.

For a pattern to be formed on the mask, a drawing operation is made, as in the ordinary electron beam drawing apparatus, by placing a glass mask 1, that is, a glass mask 1 with a Cr pattern formed thereon, on the XY stage 2 and effecting the scanning of the mask 1 under a light exposure. The pattern forming position on the mask 1 is determined by measuring the coordinate on the XY stage 2 by means of the position measuring device 3. The amount of correction of a pattern forming position on the coordinate is determined by the calculating unit 4 as will be set out below.

That is, as shown in FIGS. 3A and 3B, a whole drawing section 7 on the disk 1 is divided into a plurality of areas 8, noting that these areas 8 are independently given those correction amounts a0 to a5, . . . , and f0 to f5. According to the present invention, the correction amounts of all the points in the area are not calculated previously. Only correction amounts of some sample points in the area are calculated previously and stored. The correction amounts of remaining points are obtained or calculated from the stored data. How the correction amounts of the remaining points are obtained will be set out below.

Such mutually independent correction amounts are imparted to the corresponding divided areas 8 and, even if, for example, the correction amount increases locally, it is possible to effect drawing position correction with high accuracy.

Figure 4A:
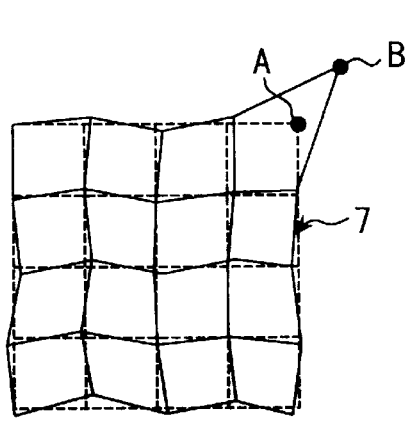
FIGS. 4A, 4B and 4C are illustrations of corrections of a pattern forming position based on both of an entire correction amount and a partial correction amount.
Figure 4B:
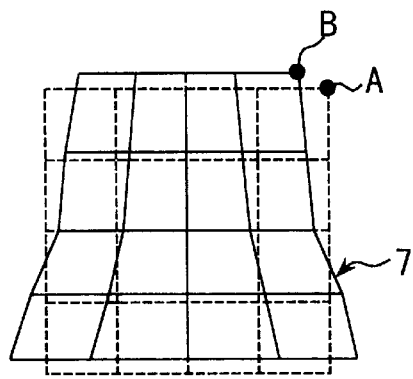
Figure 4C:
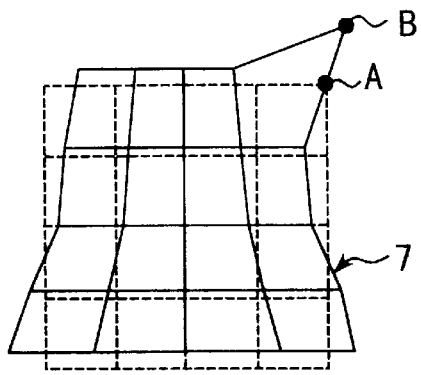

According to the present invention, it is also possible to correct the pattern forming position based on both of the entire correction amount and the partial correction amount. FIGS. 4A, 4B and 4C show the case in which the pattern forming position is corrected based on both of the entire correction amount and the partial correction amount. Of these Figures, FIG. A shows a grid point showing an ideal drawing position and FIG. B a grid point to be given by the correction method. In this connection it should be noted that, hereinafter, A represents a grid point showing the ideal drawing position and B a grid point given by the correction method.

In the determination of a pattern formation position on a mask, a pattern position correction amount (FIG. 4C) is given by adding together, for example, a pattern position correction amount (FIG. 4B) calculated based on a method described on the above-mentioned JPN PAT APPLN KOKAI PUBLICATION NO. 7-52948, that is, a procedure for calculating, based on one function, a correction value on a given coordinate on a whole surface of the drawing section, and a pattern position correction amount (FIG. 4A) calculated by a method as shown in FIGS. 3A, 3B, that is, a technique for giving an independent correction amount to a respective divided area.

Even the correction amount obtained by such an addition method as shown in FIG. 4C can be considered as a mutually independent correction amount for the respective divided area and it is possible to correct the drawing position with high accuracy.

Figure 5:
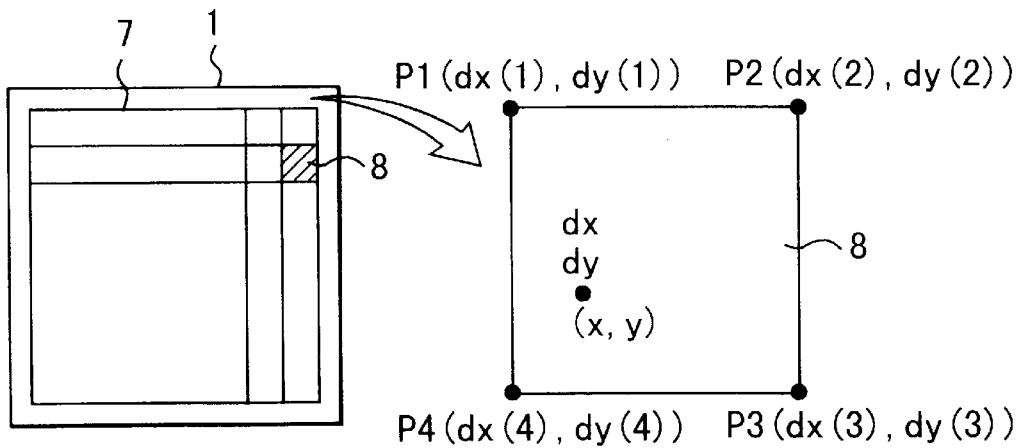
FIG. 5 is a schematic illustration of a first correction amount imparting method done on the pattern forming apparatus of the present invention.

FIG. 5 shows a first correction amount imparting method as to how any concrete correction amount be given. For a correction amount to be independently given to a respective divided area 8 in a whole drawing section, a correction amount is initially given to at least one point in the coordinate at a respective divided area 8. In the example shown in FIG. 5, correction amounts (dx(1), dy(1)), (dx(2), dy(2)), (dx(3), dy(3)) and (dx(4), dy(4)) are initially imparted to points P1, P2, P3 and P4, respectively, in the coordinate. And by interpolating these correction amounts, the correction amount (dx, dy) is found in any coordinate (x, y) in the drawing section to realize a drawing position correction with high accuracy. In the example shown in FIG. 5, the four points are initially given on the coordinate but it may be sufficient that at least one point be given there.

Figure 6:
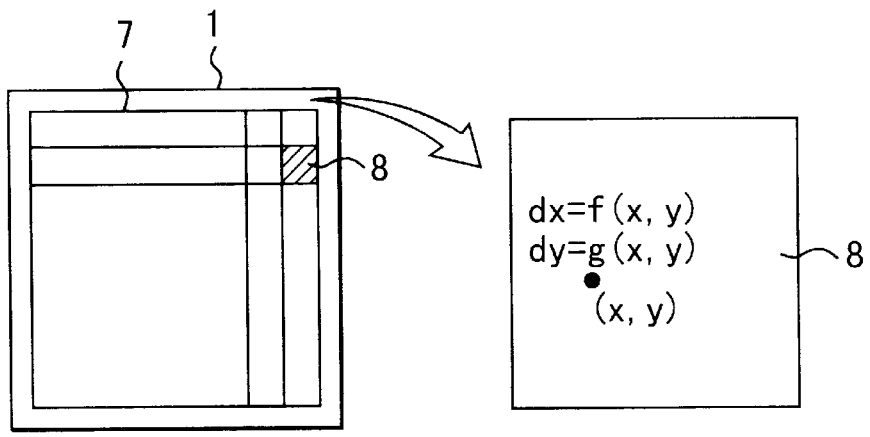
FIG. 6 is a schematic illustration of a second correction amount imparting method done on the pattern forming apparatus of the present invention.

FIG. 6 shows a second correction amount imparting method as to how any concrete correction amount be given. For any correction amount to be independently given to a respective divided area 8 in a whole drawing section 7, the correction amount on the respective divided area 8 is given as a function of a drawing position coordinate (x, y). A correction amount (dx, dy) on a given coordinate (x, y) at the divided area 8 is found by making a calculation based on a given function (dx=f(x, y), dy=g(x, y)) and it is, therefore, possible to realize drawing position correction with high accuracy.

Figure 7:
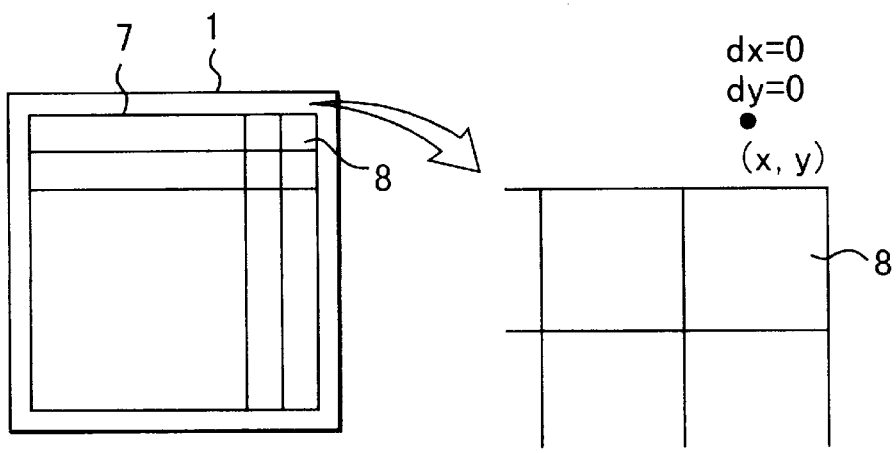
FIG. 7 is a schematic illustration of a third correction amount imparting method done on the pattern forming apparatus of the present invention.

FIG. 7 shows a third correction imparting method as to how a concrete correction amount be given. In giving any correction amount independently to a respective divided area 8 in a whole drawing section 7, if the drawing coordinate (x, y) is not found in any of the divided areas to which correction amounts have been given, calculation is done with the correction amount (dx, dy) treated as zero. By doing so, it is possible to give a correction amount to a correction-requiring area only, without the need to give the correction amounts over the whole drawing section, and to realize the correction of the drawing position with high accuracy and do it in an open-ended fashion.

Figure 8:
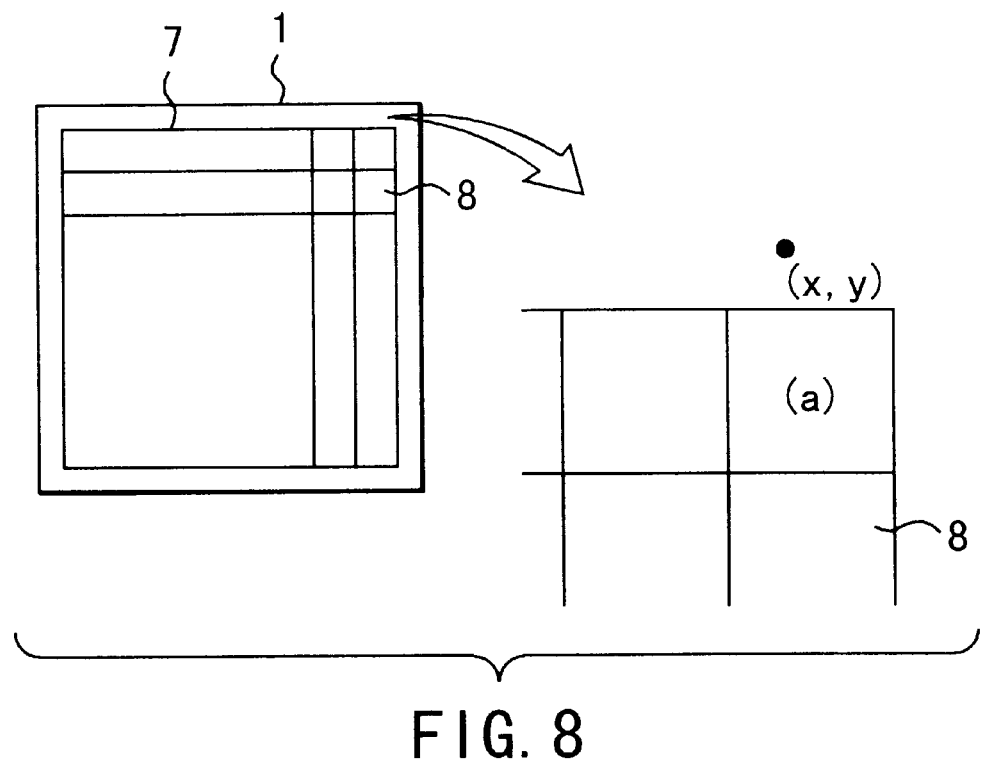
FIG. 8 is a schematic illustration of a fourth correction amount imparting method done on the pattern forming apparatus of the present invention.

FIG. 8 shows a fourth correction amount imparting method as to how a concrete correction amount be given. If, in giving a correction amount independently to a respective divided area 8 in a whole drawing section, any drawing coordinate (x, y) is not found at any of those divided areas to which those correction amounts have been given, a correction amount of the drawing coordinate (x, y) is found through an extrapolation from a correction amount at an area a present near that drawing coordinate. By doing so, it is possible to give a correction amount to a correction-requiring area only, without the need to give those correction amounts over the whole drawing section, and to realize the correction of a drawing position with high accuracy and do it in an open-ended fashion.

Figure 9:
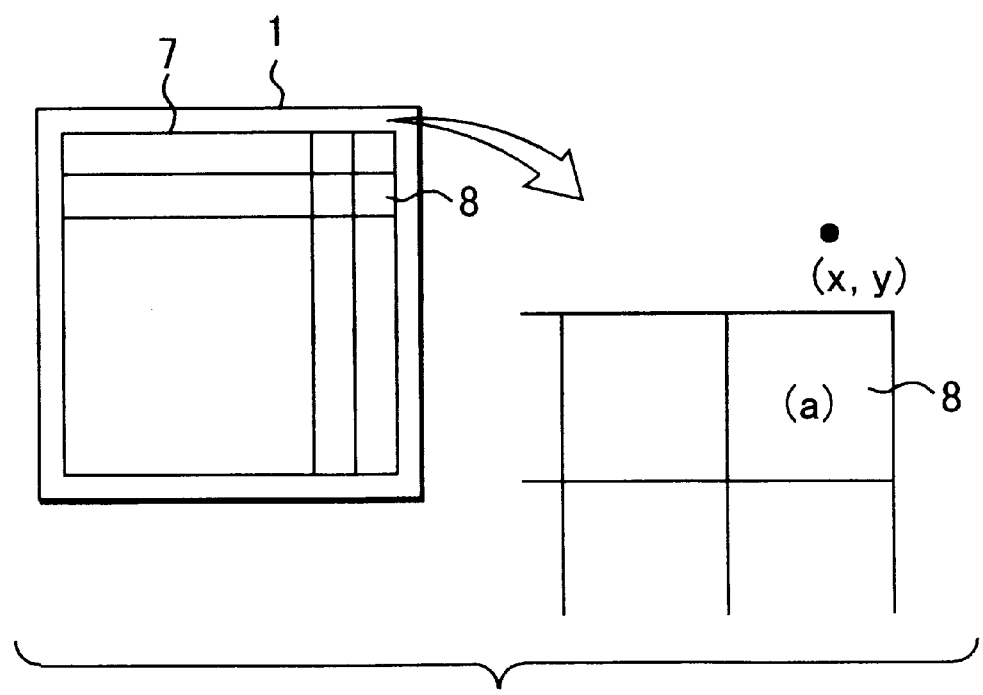
FIG. 9 is a schematic illustration of a fifth correction amount imparting method done on the pattern correction forming apparatus of the present invention.

FIG. 9 shows a fifth correction amount imparting method as to how a concrete correction amount be given. If, in giving correction amounts to respective divided areas 8 in a whole drawing section 7, any drawing coordinate (x, y) is not found in those divided areas to which correction amounts have been given, a correction amount at an area a present near that drawing coordinate is applied as it is and treated as the correction amount of the coordinate (x, y). By doing so, it is possible to give a correction amount to a correction-requiring area only, without the need to give correction amounts to the whole drawing section, and to achieve the correction of the drawing position with high accuracy in an open-ended fashion.

Figure 10:
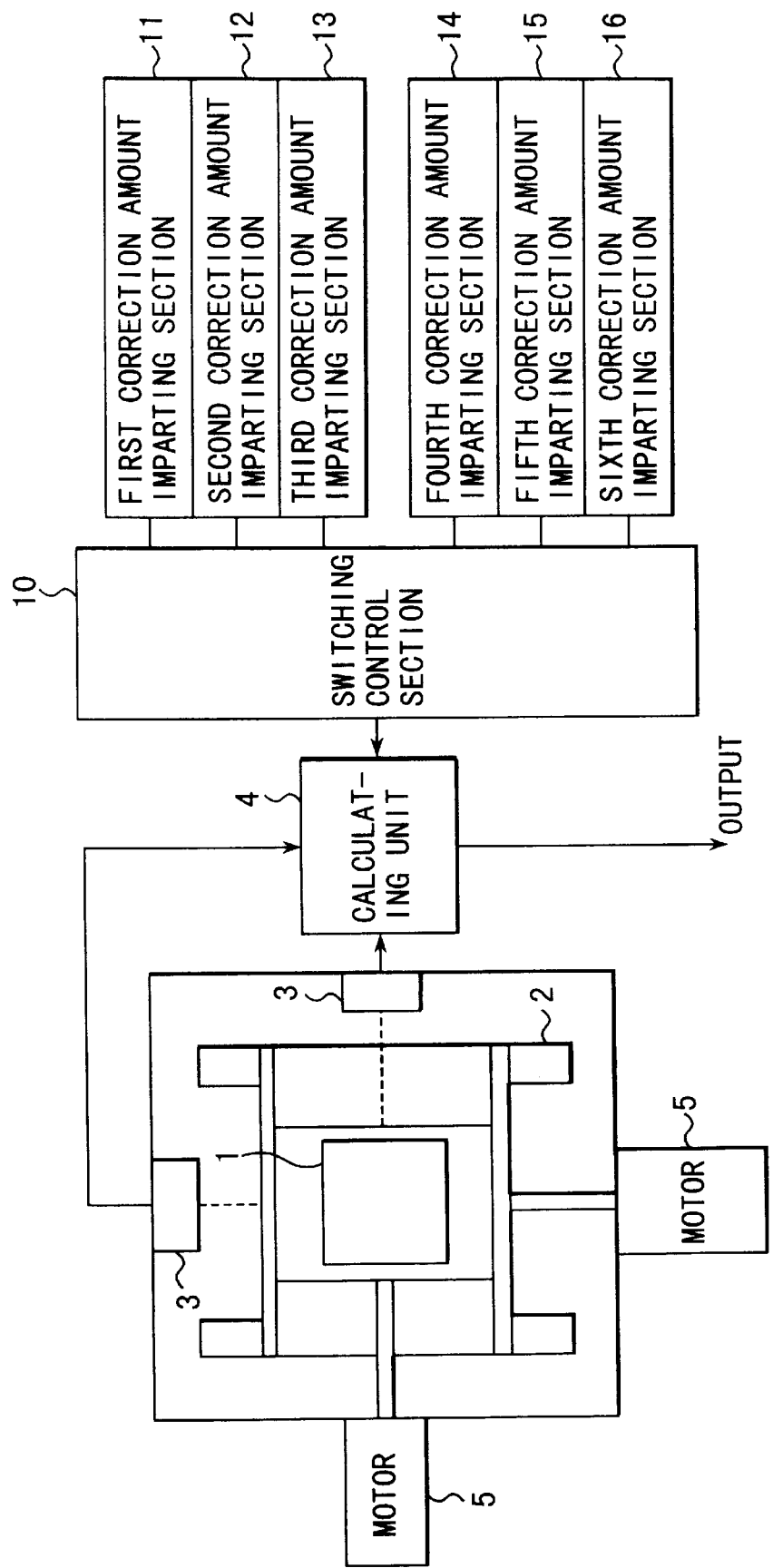
FIG. 10 is a view showing another practical basic form of the pattern forming apparatus of the present invention.

Although the above-mentioned pattern forming apparatus selects any of the first through fifth correction amount imparting methods and calculates its correction amount by the calculating unit 4, it can be achieved relative to one mask through the use of two or more of the first to fifth correction amount imparting methods, depending upon the configuration of the mask, type of deformation and/or stage coordinate information indicating the drawing positions. Such an explanation will be given below with reference to FIG. 10. An apparatus shown in FIG. 10 includes first through fifth correction amount imparting sections 11 through 16 for performing the first through fifth correction amount imparting methods embodied with a software or hardware. These first through fifth correction amount imparting sections 11 through 16 are connected via a switching control section 10 to a calculating unit 4. The switching control section 10 selects at least one of the first through fifth correction amount imparting sections 11 to 16, depending upon the configuration of the mask, type of deformation and/or the stage coordinate information indicating the drawing position, so as to allow a correction amount to be calculated through the selected correction amount imparting section.

The above-mentioned apparatus performs the correction amount imparting processing, depending upon an involved state of the correction area, such as in the case of a correction-requiring area being present only at a central section of the mask or not being present at a marginal portion of the mask.

Although an explanation has been given, by way of example, about the drawing coordinate correction by the electron beam drawing apparatus, the present invention is not restricted to the electronic beam drawing apparatus and can be applied in modified form to various types of particle beam drawing apparatus and other types of pattern forming apparatus. Although an explanation has been given, by way of example, about the pattern transferring mask as a pattern drawing sample, the present invention can also be applied to using a semiconductor wafer as such a sample.

According to the present invention, the whole drawing section of the sample is divided into a plurality of areas and the drawing positions of the divided areas are mutually independently corrected. And if, for example, a correction amount is locally greater in a portion of the whole drawing section, it is possible to correct the drawing areas with high accuracy.

Further, according to the present invention, the whole drawing section of the sample is divided into a plurality of areas and correction can be made at the respective areas in the drawing section, that is, correction can be made, taking into consideration the drawing positions in the whole drawing section. It is, therefore, possible to achieve, with high accuracy, the correction of the drawing positions on the whole drawing section of the sample.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A pattern forming apparatus configured to form a pattern on a sample based on original drawing data which indicates a pattern forming position, comprising:

a correction circuit configured to produce corrected drawing data for each of a plurality of subregions obtained by dividing an entire region of the sample, the corrected drawing data indicating a corrected pattern-forming position; and a drawing device configured to draw a pattern on the sample based on the corrected drawing data, wherein said correction circuit is configured to store correction data indicating a forming position of reference points of each subregion, to produce correction data indicating a forming position of any points within the subregion using the correction data of the reference points, and to produce the corrected drawing data by adding the correction data to the original drawing data, and wherein said reference points are four corner points of each subregion and said correction circuit is configured to interpolate the correction data of the reference points to obtain the correction data of the points within each subregion.

2. A pattern forming apparatus configured to form a pattern on a sample based on original drawing data which indicates a pattern forming position, comprising:

a correction circuit configured to produce corrected drawing data for each of a plurality of subregions obtained by dividing an entire region of the sample, the corrected drawing data indicating a corrected pattern-forming-position; and a drawing device configured to draw a pattern on the sample based on the corrected drawing data, wherein said correction circuit is configured to store correction functions defined for each subregion, the functions indicating a forming position of any points of each subregion, and to produce correction data indicating a forming position of any points within a particular subregion using the correction function defined for a respective subregion.

3. A pattern forming apparatus configured to form a pattern on a sample based on original drawing data which indicates a pattern forming position, comprising:

a correction circuit configured to produce corrected drawing data for each of a plurality of subregions obtained by dividing an entire region of the sample, the corrected drawing data indicates a corrected pattern-forming-position; and a drawing device configured to draw a pattern on the sample based on the corrected drawing data, wherein said correction circuit is configured to store correction data indicating a forming position of a first group of the subregion, which are located in a central portion of the entire region of the sample, and to produce correction data indicating a forming position of points of subregions outside the first group of the subregions based on the correction data of the first group of the subregions.

4. The pattern forming apparatus according to claim 3, wherein said correction circuit is configured to use correction data of a subregion in the first group of the subregions which is nearest to a subregion outside the first group of the subregions as the correction data of the points of subregion outside the first group of the subregions.

5. The pattern forming apparatus according to claim 4, wherein said correction circuit is configured to extrapolate the correction data of the first group of the subregions to produce the correction data of points of the subregion outside the first group of the subregions.

6. A pattern forming apparatus configured to form a pattern on a sample based on original drawing data which indicates a pattern forming position, comprising:

a correction circuit configured to produce corrected drawing data for each of a plurality of subregions obtained by dividing an entire region of the sample, the corrected drawing data indicating a corrected pattern-forming-position; and a drawing device configured to draw a pattern on the sample based on the corrected drawing data, wherein said correction circuit is configured to store correction data indicating a forming position of reference points of a first group of the subregions which is located in a central portion of the entire region of the sample, to produce correction data indicating a forming position of any points within a subregion included in the first group of the subregions using the correction data of the reference points, to set correction data of points of a subregion outside the first group of the subregions to zero, and to produce the corrected drawing data by adding the correction data to original drawing data.

* * * * *